(12) United States Patent
Wang et al.

(10) Patent No.: US 6,462,883 B1
(45) Date of Patent: Oct. 8, 2002

(54) OPTICAL COUPLING SYSTEMS

(75) Inventors: Zhijiang Wang, Diamond Bar; Qinyue Yu, Tustin; Ying Wang, Diamond Bar, all of CA (US)

(73) Assignee: Apollo Instruments Inc., Irvine, CA (US)

( * ) Notice: Subject to any disclaimer, the term of this patent is extended or adjusted under 35 U.S.C. 154(b) by 224 days.

(21) Appl. No.: 09/644,804

(22) Filed: Aug. 23, 2000

(51) Int. Cl.[7] .......................... G02B 27/30; H01S 3/08
(52) U.S. Cl. ........................................ 359/641; 372/108
(58) Field of Search ........................... 359/618, 641; 372/6, 71, 108; 606/17

(56) References Cited

U.S. PATENT DOCUMENTS

| | | | | |
|---|---|---|---|---|
| 3,657,473 | * | 4/1972 | Corcoran | 347/255 |
| 4,054,361 | * | 10/1977 | Noguchi | 348/203 |
| 4,370,026 | * | 1/1983 | Dubroeucq et al. | 355/71 |
| 4,544,898 | * | 10/1985 | Pernick | 359/244 |
| 5,081,637 | * | 1/1992 | Fan et al. | 372/101 |
| 5,485,225 | * | 1/1996 | Deter et al. | 348/744 |
| 5,557,475 | * | 9/1996 | Nightingale et al. | 359/333 |
| 5,787,107 | * | 7/1998 | Leger et al. | 359/619 |

\* cited by examiner

Primary Examiner—Ricky Mack
(74) Attorney, Agent, or Firm—William Michael Hynes; Townsend and Townsend and Crew, LLP

(57) ABSTRACT

In the present invention, the methods and apparatus for making efficient laser beam coupling are disclosed. In particular, new structures for shaping and rearranging laser beams from diode laser array are disclosed. Along with the use of unique methods for coupling pumping laser beam into optical fiber or other media, high efficiency can be achieved. These aspects of the present invention will facilitate the realization of high-efficiency and high-power fiber lasers or other solid state lasers. The beam shaping structures can significantly improve the quality of the beams from diode laser array, and is easy to realize and less demanding in system alignment. Thus, a diode-pumped solid state laser of this invention may comprise a laser medium, a focusing means, a beam source comprising at least one laser diode array, a beam offsetting means, an image optics and a beam redirection means.

13 Claims, 12 Drawing Sheets

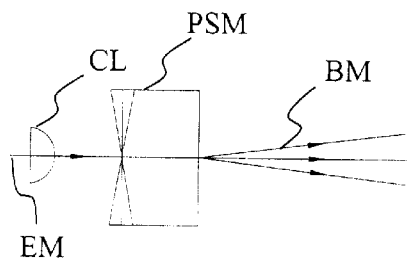
*Fig. 5(a)*
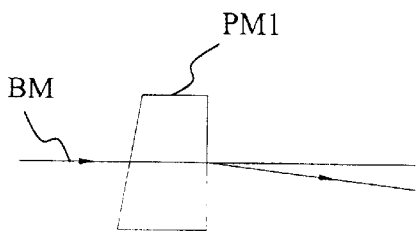
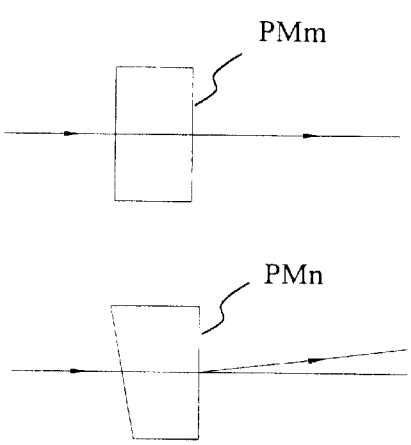
*Fig. 5(b)*
*Fig. 5(c)*
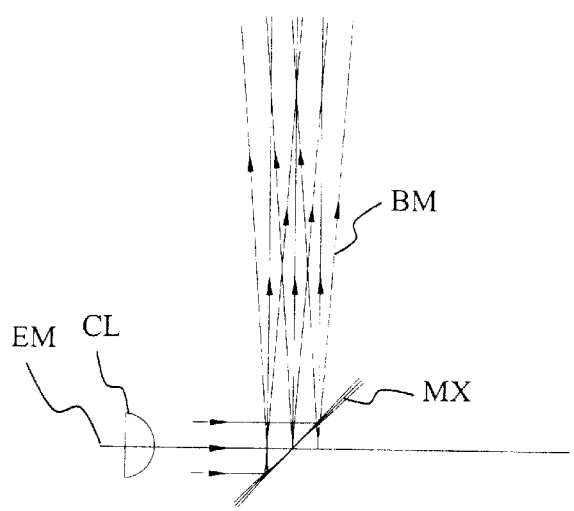
*Fig. 6*

OPTICAL COUPLING SYSTEMS

BACKGROUND OF THE INVENTION

1. Technical Field

The present invention relates to optical coupling systems for coupling semiconductor laser with optical fiber, and in particular relates to methods for diode-laser beam shaping for construction of high-efficiency and high-power solid state lasers including fiber lasers, and for high efficiency transmission of diode laser power through optical fiber.

2. Background Art

The development of diode pumped fiber lasers has been rather successful recently. The scaling of various physical effects has greatly benefited this development. Diode lasers can provide concentrated pumping energy and thus enhance the efficiency of fiber lasers. In end-pumped fiber lasers, a large outer cladding is used in cladding pumping. Pump light, often piped through fibers from pump lasers, enters the outer core (inner cladding), where it is confined so that it passes through the inner core, exciting the laser species. Stimulated emission from the laser species remains in the inner core. By converting the low brightness beam from the pump diode bar into a tighter beam, pumping a fiber laser can multiply brightness by a factor of more than 1000. Efficient configuration or scheme could allow higher brightness to be achieved, and the resulting tight laser beam can be coupled more efficiently into media such as optical fiber, laser fibers, or media doped with active species for other solid state lasers. Take fiber laser as an example. Currently, a typical fiber laser device includes a tens-of-meters double clad silica fiber with a small diameter and small NA core doped with active species, centered within a much larger inner cladding, surrounded by a soft low index fluoropolymer providing an acceptance NA of 0.45 for pump radiation. Pumping laser beams from laser diodes are coupled into the fiber inner cladding through the dichroic end mirror. (HR laser, HT pump). Although proper geometry is essential for increasing the efficiency of cladding pumping, good method of making tighter beam will allow more diode laser power to be injected into the fiber laser. This can reduce the size of cladding, shorten the length of the fiber, and increase the efficiency of a fiber laser.

A typical high-power laser diode array (LDA) has an a broad area light emitting aperture (1 cm×1 $\mu$m) comprising light emitting elements (emitters) which are multiple spaced apart segments. In one typical commercial LDA product, for example, each segment has a width less than 200$\mu$m, and may be divided into 20 sub-segments. Each sub-segment has an aperture width of 3–6 $\mu$m, and emits about 30 mW–60 mW. The effective aperture size in the transverse direction perpendicular to the plane of laser active region (the fast axis) is about 1 $\mu$m. Typical fast axis divergence is 30–40 degree and slow axis divergence is 10–15 degree. A typical high-power LDA can deliver 20 W laser power. Those more powerful can deliver 40 W or 60 W with this geometry. By using diode array stacks, however, 500–1400 W can be obtained. Because of the elongated geometry of LDA, it has been always a challenge to couple or inject high power (such as 4000 W) into a fiber cladding aperture (such as an aperture of 200 $\mu$m×500 $\mu$m, NA 0.45).

In order to send more power into optical fiber, many efforts have been made to concentrate light from diode laser arrays. There are a number of patents dealing with concentrating multiple emitter laser diode beams, such as U.S. Pat. Nos. 5,887,096, 5,825,551, 5,808,323, 5,805,748, 5,513, 201, and PCT WO99/35724, and PCT97/14073. Some other disclosures are shown in U.S. Pat. Nos. 5,802,092, 5,793, 783, 5,790,310, 5,594,752, 5,579,422, 5,568,577, 5,333,077, 5,185,758, 5,139,609, and 4,428,647.

In U.S. Pat. No. 5,887,096, an arrangement in which a reflection lens system shapes and guides beams from a rectilinear laser diode array with beam outlet surfaces lying in a common plane is disclosed. In U.S. Pat. Nos. 5,825,551, 5,808,323, 5,805,748, different laser beam shaping systems are disclosed. With these methods, an elongated laser beam is divided into a plurality of beam sections that is then rearranged into a more circular cross-section more suitable for pumping. Thus, beam rearrangement is achieved in these Patents using two parallel mirrors, using multiple small mirrors, or using multiple refractive parallel plates, respectively. In PCT WO97/14073, Hollemann et al shows a device for combining and shaping the radiation from several laser diode cells consisting of at least two laser diodes. For the systems discussed in the above disclosures, the requirements in system alignment can be difficult to meet in practice. In U.S. Pat. No. 5,805,323, a single row of mirrors is also used to shape the beams from a laser diode array to a parallelogram-shaped laser beam bundle. But the mirror is difficult to realize in practice. In U.S. Pat. No. 5,513,201, an optical-path rotating device comprising a group of complicated prisms is disclosed. In PCT 99/35724 and in an earlier publication (SPIE Proceedings Vol. 3008, 202, 1997), Goring et al disclosed an optical system for symmetrizing the beam of one or more superimposed high-power diode laser by using refraction components. A common feature of the prior art is that one reflection component is associated with each beam from the diode laser array. This leads to low flexibility and difficulty in manufacturing. In U.S. Pat. No. 4,428,647, Sprague et al disclose systems in which each laser emitter of a diode laser array has its own lens mount adjacent to it in the space between the laser array and objective lens of the system. The purpose of the lens array is to change the angle of divergence of light beams leaving the emitting surface of the laser array at the slow axis so that the light beam can be collected efficiently by the objective lens. Although brightness can be increased with slow axis collimation, beam shaping in this way can never achieve results as good as desired because the difficulty in the fabrication of the slow axis collimator. In U.S. Pat. No. 5,185,758, Fan et al describe a method for scaling a pumped medium to higher power with multiple light source. The output beam of each light source is substantially collimated by respective collimating optics, and the beams of sources are substantially parallel to each other after collimation. An optical system is provided to focus the collimated and parallel beams. The methods described in U.S. Pat. Nos. 5,802,092, 5,793,783, 5,790,310, 5,594,752, 5,579,422, 5,568,577, 5,333,077, and 5,139,609 are similar to the methods mentioned above. However, since lens arrays can only collimate the beam from the diode array to a limited extent, obvious divergence still exists. Because of the beam divergence, laser diode arrays must be close to optical fiber so that the beam spot is small enough to achieve effective coupling. When multiple laser diode arrays are combined, the dimension of beam spot on the fiber aperture plane becomes larger due to the increased distance between laser diode arrays and the fiber aperture. As a result, these methods can not efficiently combine the beams from a plurality of diode laser arrays in to an optical fiber. For example, with these methods, it is impossible to effectively couple the beams from 200 pieces of 20 W diode laser bars into a fiber to make a high-power fiber laser.

SUMMARY OF THE INVENTION

Accordingly, it is the principal object of the present invention to provide methods and devices to rearrange and combine the beams from laser diode arrays or stacks so that high-efficiency and high-power coupling with target, such as an optical fiber, can be achieved. High-efficiency and high-power solid state lasers such as fiber lasers, and high-efficiency transmission of diode laser power through optical fiber can be achieved.

It is another object of the present invention to teach new methods of rearranging diode laser beam into a more circular laser beam.

To achieve the foregoing and other objects, and in accordance with the purposes of the present invention, as embodied and broadly described herein, a preferred apparatus of this invention may comprise at least one laser diode array, a beam offsetting means, a beam redirection means, and an optical system disposed between said beam offsetting means and said beam redirection means, wherein said beam offsetting means offsets the beams from the emitters of said laser diode array, and said optical system allows each of the beams to be focused on said beam redirection means so the beams travel in the same direction after the beam redirection means.

A preferred apparatus for a fiber laser of this invention may comprise at least one laser diode array, a laser fiber with inner cladding, a beam offsetting means, a beam rearranging means, an optical system disposed between said beam offsetting means and said beam redirection means, and a focusing means for coupling the beam from said laser diode array into said inner cladding.

Additional objects, new features and advantages of the present invention will be set forth in part in the following description. Further scope of applicability of the present invention will become apparent from the detail description of the invention provided hereinafter. It should be understood, however, that the detailed description of the invention and the specific examples presented, while indicating preferred embodiment of present invention, are provided for illustration purposes only, because various changes and modifications within the scope and spirit of the present invention will become apparent to those of ordinary skill in the art from the detail description of the invention that follows.

BRIEF DESCRIPTION OF THE DRAWINGS

The accompanying drawings serve to explain the principles of the invention, in which:

For comparison purpose, FIG. 3(c)

FIG. 5(a) illustrated an embodiment where the beam offsetting means including collimation lens CL and the beam offsetting prism group PSM; FIG. (5b) shows the relationship between the LDA emitter line and PSM; FIG. (5c) shows the beam paths from three prisms in PSM.

FIG. 6 schematically shows a beam offsetting means in which a mirror group MX is used for beam offsetting.

DETAILED DESCRIPTION OF THE INVENTION

Figure 1:
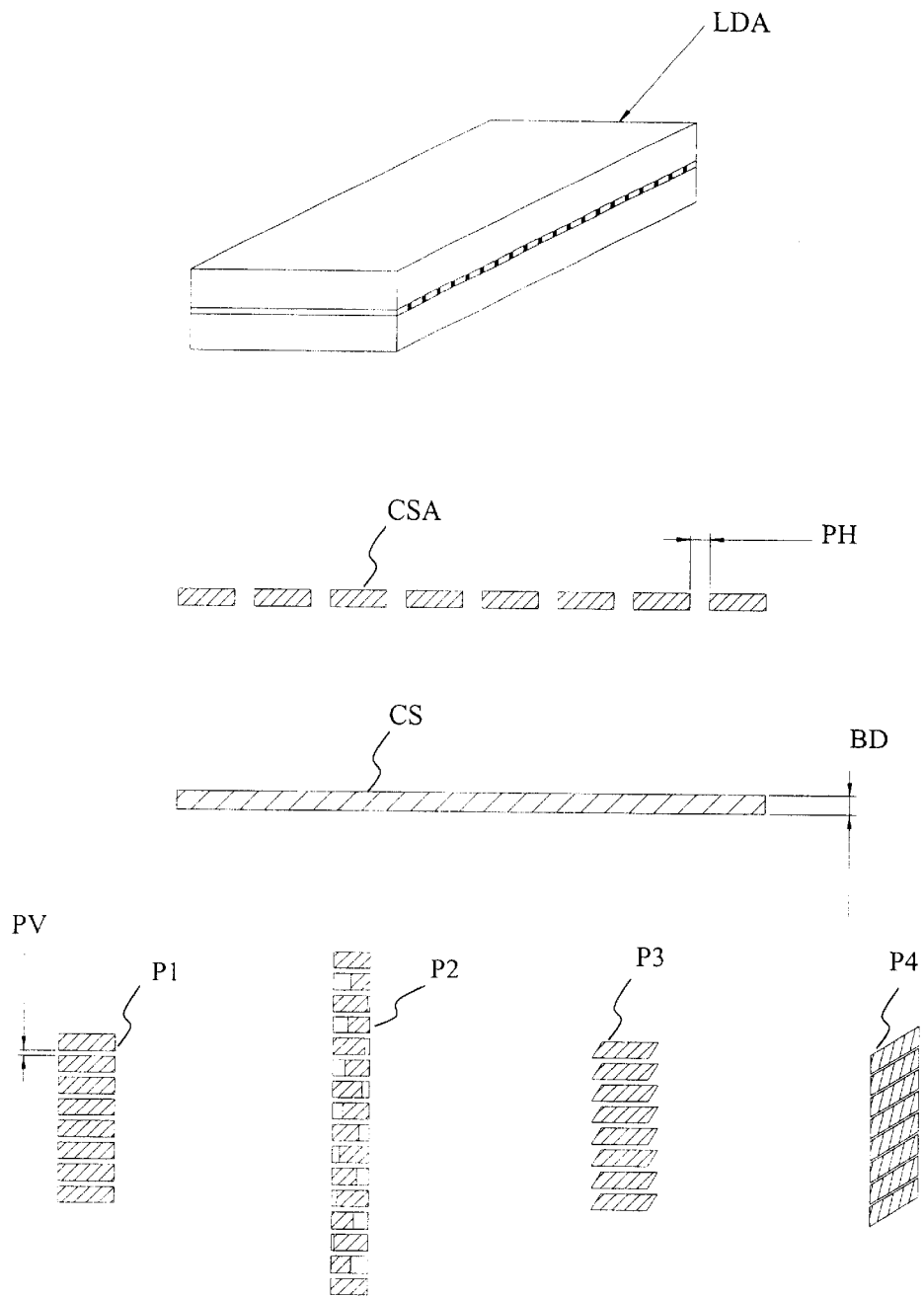
FIG. 1 shows the illustration of some possible results of shaping and rearrangement of LDA beams, in which CSA is the schematic view of emitter beam pattern of a typical laser diode array LDA.

In the present invention, the methods and apparatus for making efficient laser beam coupling are disclosed. In particular, new structures for shaping and rearranging laser beams from diode laser array are disclosed. Along with the use of a unique method for coupling pumping laser beam into optical fiber or other media, high efficiency can be achieved. These aspects of the present invention will facilitate the realization of high-efficiency and high-power fiber lasers or other solid state lasers. The beam shaping structures can significantly improve the quality of the beams from diode laser array, and is easy to realize and less demanding in system alignment. Thus, along with the coupling mechanisms disclosed, efficient coupling of diode lasers into optical fiber for high power injection can be made. Thus the system can be used for the construction of high-efficiency and high-power fiber or other solid state lasers.

Thus, a method or arrangement is used for beam rearranging and shaping, in which the beams from laser diode array are divided into a plurality of sections along the slow axis, offset from each other along the fast axis, and the sections of beams are then recombined along their fast axis so that the Lagrange invariant of the resulting beam increased approximately by n-fold in fast axis and reduced approximately by n-fold in slow axis.

Thus, a preferred apparatus of this invention may comprise at least one laser diode array, a beam offsetting means, a beam redirection means, and an optical system disposed between said beam offsetting means and said beam redirection means, wherein said beam offsetting means offsets the beams from the emitters of said laser diode array, and said optical system allows each of the beams to be focused on said beam redirection means so the beams travel in substantially the same direction after the beam redirection means, whereby the Lagrange invariant of the resulting beam increased approximately by n-fold in fast axis and reduced approximately by n-fold in slow axis.

Thus, a preferred apparatus for beam rearrangement of laser diode array can be made, comprising at least one laser diode array emitting laser beams, a beam offsetting means, and a beam rearranging means, wherein said beam offsetting means divides beams from said laser diode array into a plurality of sections along the slow axis and offsets the divided beams from each other along the fast axis, and said beam rearranging means rearranges the sections of beams along their fast axis so that the Lagrange invariant of the resulting beam increased approximately by n-fold in fast axis and reduced approximately by n-fold in slow axis.

Thus, a preferred beam-shaping device comprises a laser diode array, a beam offsetting means, a beam redirection means, and an optical system disposed between said beam offsetting means and said beam redirection means, wherein the beam offsetting means includes a cylindrical-like collimating lens placed in front of a laser diode array such that the cylinder axis of said lens forms a predetermined angle with the emitter line of said laser diode array, wherein the beam rearranging means is a mirror group in which a plurality of mirrors are stacked substantially along the direction of fast axis and each mirror is offset from the adjacent mirror by a predetermined angle, wherein said beam offsetting means collimates the beams from said laser diode array into sections of beams and offset the beams from each other along the fast axis, and said optical system images each section of emitters of said laser diode array on a predetermined mirror in said mirror group, respectively, and the beams are then redirected and reflected to substantially the same direction, whereby the Lagrange invariant of the resulting beam increased approximately by n-fold in fast axis and reduced approximately by n-fold in slow axis.

Thus, a preferred beam-shaping device comprises a laser diode array, a beam offsetting means, a beam redirection means, and an optical system disposed between said beam offsetting means and said beam redirection means, wherein the beam offsetting means includes a cylindrical-like collimating lens placed in front of a laser diode array such that the cylinder axis of said lens forms a predetermined angle with the emitter line of said laser diode array, wherein the beam redirection (rearranging) means is an optical wedge group in which a plurality of optical wedges are stacked substantially along the direction of fast axis, wherein said beam offsetting means collimates the beams from said laser diode array into sections of beams and offset the beams from each other along the fast axis, and said optical system images each section of emitters of said laser diode array on a predetermined wedge in said wedge group, respectively, and the beams are then refracted by the wedges so that the exit beams travel in substantially the same direction after the beam redirection means, whereby the Lagrange invariant of the resulting beam increased approximately by n-fold in fast axis and reduced approximately by n-fold in slow axis.

Thus, a preferred beam-shaping device comprises a laser diode array, a beam offsetting means, a beam redirection means, and an optical system disposed between said beam offsetting means and said beam redirection means, wherein the beam offsetting means includes a multi-section collimation lens placed in front of a laser diode array in which the cylinder axis of each section in the multi-section collimation lens is offset from the nearby section for a predetermined distance and is substantially parallel with the emitter line of said laser diode array, wherein the beam rearranging means is a mirror group in which a plurality of mirrors are stacked substantially along the direction of fast axis and each mirror is offset from the adjacent mirror by a predetermined angle, wherein said beam offsetting means collimates the beams from said laser diode array into sections of beams and offset the beams from each other along the fast axis, and said optical system images each section of emitters of said laser diode array on a predetermined mirror in said mirror group, respectively, and the beams are then redirected and reflected to substantially the same direction, whereby the Lagrange invariant of the resulting beam increased approximately by n-fold in fast axis and reduced approximately by n-fold in slow axis.

With the inclusion of above apparatus, the objectives of constructing high-efficiency solid state lasers can then be achieved. Thus, a high-efficiency diode-pumped solid state laser apparatus can be made comprising a laser fiber with its core doped with active species (for cladding pumping fiber laser) or a laser rod (or disc) doped with active species, a focusing means, and a beam source comprising at least one laser diode array along with beam offsetting means, an image optics and beam redirection means, wherein said focusing means is disposed between said beam source and the aperture of said fiber or laser rod (or disc) and focuses the beam from said beam source onto the aperture of said laser fiber or laser rod (or disc), and wherein an optical relay system can be included for combination of beams from a plurality of laser diode arrays.

With the use of above apparatus, efficient coupling between laser diode array and optical fiber can be achieved for efficient beam transmission. Thus, a fiber coupled laser diode array system of this invention may comprise at least one laser diode array, at least one optical fiber, means for beam collimation, offsetting, means for beam rearrangement (redirection), and means for beam focusing, wherein the laser beams from said laser diode array are collimated by said means for beam collimation, offsetting, rearranged by means for beam rearrangement, and then focused on to the aperture of said optical fiber by said means for beam focusing.

Beam Shaping and Rearrangement

Although laser diode arrays (LDA) have been often used in pumped solid state lasers, the potential efficiency of these arrays has not been fully realized because of poor beam quality. In theory, by beam shaping, beams with much better quality can be obtained. The configuration of emitter structure of LDA and the beam structure and geometry are well known in the art. For example a typical commercially available diode LDA has 19 groups of emitters. Each group has a dimension of 200 microns. The total length of LDA at slow axis is 10 mm, while the dimension at fast axis is only about 1 micron. In general, the so-called beam shaping is to divide and rearrange the beams from laser diode array, and reduce the Lagrange invariant in slow axis. FIG. 1 shows the illustration of some possible results of shaping and rearrangement of LDA beams, in which CSA is the schematic view of emitter beam pattern of a typical LDA. Pattern P1 illustrates shape of the resulting beam cross-section that is formed when the LDA beams are divided according to the spacing between the emitters and rearranged along the fast axis of the beams. The schematic views P3 and P4 show another two possible beam cross-sections after beam rearranging by using different methods. Among P1, P3, and P4, beam spot P1 represents the best beam quality comparing with the other two.

The object of beam shaping and rearrangement is met by the features of claim 1 to 13. The beam shaping and rearrangement is mainly achieved by proper arrangement between the collimation lens and the emitter line of an LDA (laser diode array) so that the beams from the emitters are divided and offset from each other along the fast axis. Thus, a method or arrangement is used for beam shaping, in which the beams from LDA are collimated and divided into a plurality of sections along the slow axis and the sections are offset from each other in the direction of fast axis. The sections of offset beams are then rearranged or re-aligned along their fast axis. Ideally, the Lagrange invariant of the resulting beam increased approximately by n-fold in fast axis and reduced approximately by n-fold in slow axis comparing with the Lagrange invariant of the beam from the laser diode array. Although, it is preferred that the optics is arranged so that the beam division is made according to the spacing between emitters to achieve high brightness, the pattern of LDA emitters can also be simplified as CS in FIG. 1. That is, in such case, the number of emitters in LDA is not considered in beam dividing, and it also means that each offset beam spot could be formed by a beam from part of a single emitter or by beams from multiple emitters as shown by P2 in FIG. 1. Such consideration is useful when an LDA with a large number of emitters are used. Thus, although it is preferred to divide the beams from the emitters and rearrange them into the patterns such as P1, P3 and P4, the spacing between the emitters (PH) is not particularly considered in the description below. Therefore, the number of division of the beams from LDA is not limited by the number of emitters of the LDA, and besides pattern P1, P3, and P4, beam pattern P2 can also be formed and provide improvement to the diode laser beam quality. Such division will make the beam shaping structure flexible in practice.

Figure 2:
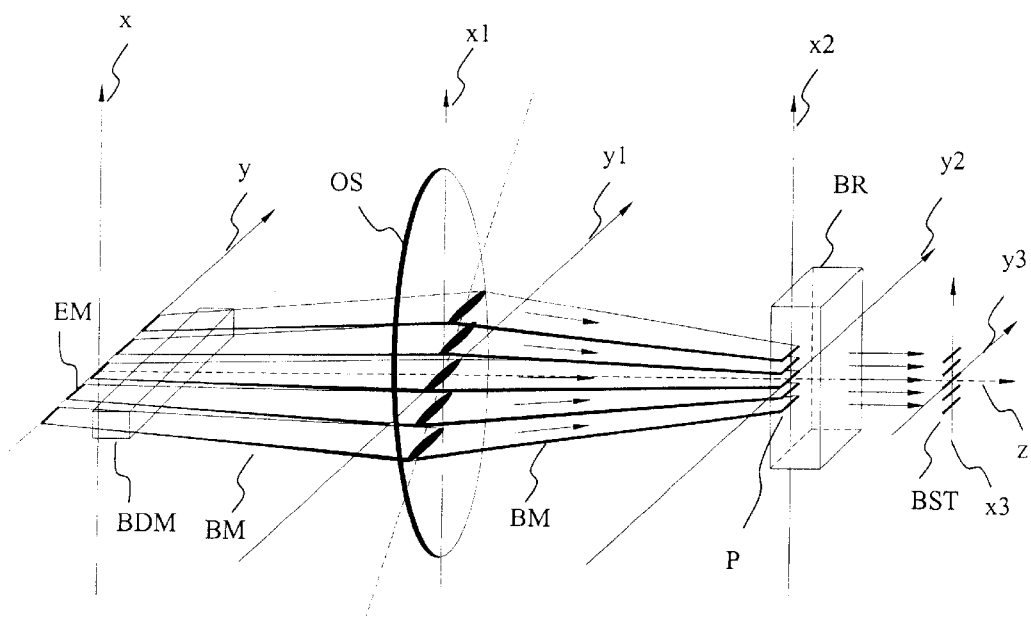
FIG. 2 schematically illustrated the general principle of the invention.

FIG. 2 shows a general scheme of the invention. EM is the emitter line of an LDA. For clarity, only five emitters are shown. BDM is a beam offsetting means. With this optics, the beams from the emitters are offset along the x-axis. The orientations of the beam spots are illustrated in several different coordinate systems (x, y; x1, y1; x2, y2; x3, y3). OS is an optical system that images the offset beams onto a beam redirection means BR, with each beam hitting BR with a different incident angle to form a rearranged beam spot P. BR then steers the direction of each beam so the beams travel in substantially the same direction after the beam redirection means. Hence, the shape of beam spot BST after BR is substantially the same as P. Therefore, the Lagrange invariant of the resulting beam increased approximately by n-fold in fast axis and reduced approximately by n-fold in slow axis. The optimized beams (having a beam spot shape as P (e.g. P1 or P2) from BR can then be focused efficiently into optical fiber or other desired medium. It is obvious many kinds of combination of optics can be made. For example, BDM and OS can be combined into a single optical component. Thus a single optical component can play both roles of BDM and OS. It is also obvious that OS can be combined with BR into a single optical component.

Some embodiments for LDA beam rearrangement are disclosed below.

Figure 3A:
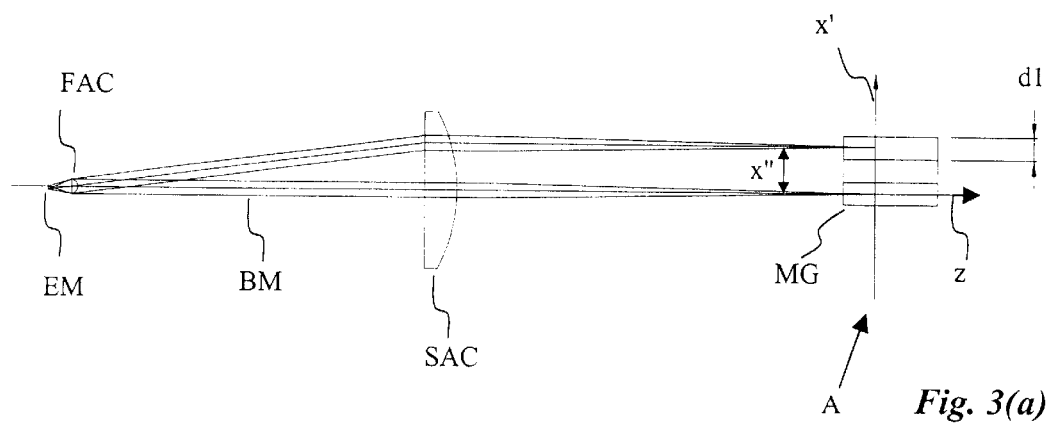
FIG. 3(a) and FIG. 3(b) show two views of an embodiment of current invention for laser diode beam shaping, in which FAC is placed such that its cylinder axis forms a small angle with the emitter line, and the beam redirection means is a mirror group.
Figure 3B:
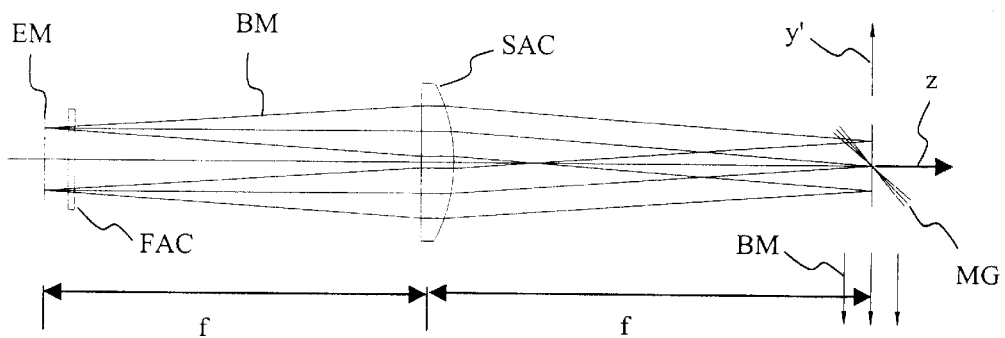
Figure 3C:
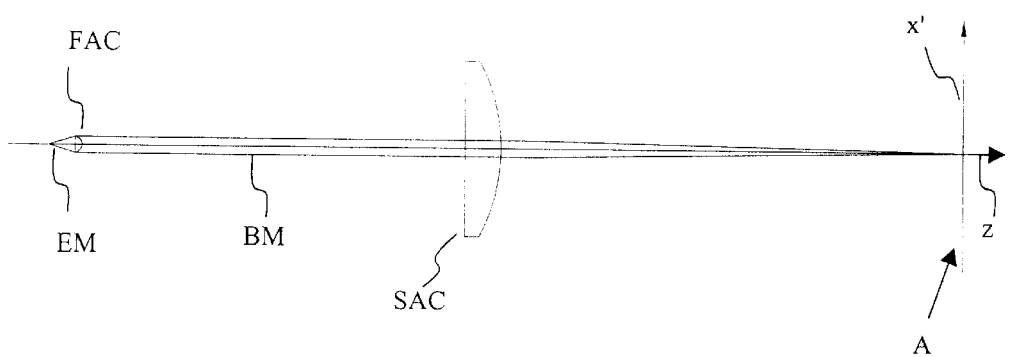
FIG. 3(d) shows two views of a common situation, in which the cylinder axis of FAC is parallel with the emitter line, where beam offsetting will not a occur.
FIG. 3(e) schematically illustrated the relationship between FAC and the emitters of an LDA.
Figure 3D:
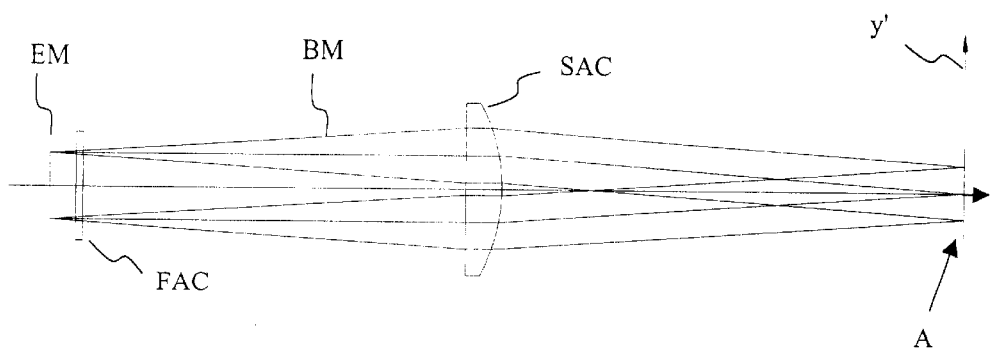
Figure 3E:
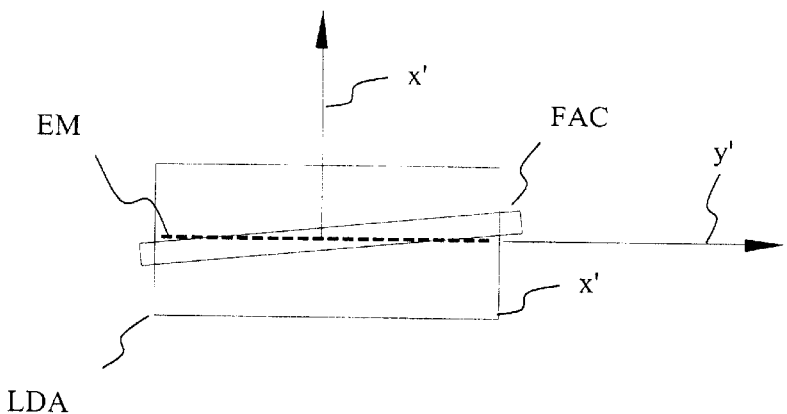

An embodiment is shown by the top and side views of the optical path as in FIG. 3(a) and FIG. 3(b). EM is the LDA emitter, BM is a laser beam, and the distances of the objective SAC from EM and from the image plane A are the focal length f. The fast axis collimator (FAC) collimates the laser beams from EM in the fast axis into substantially collimated beams that are focused by SAC at image plane A. If the cylinder axis of FAC is parallel with EM (as shown in FIG. 3(c) and FIG. 3(d)), the beam spots focused at A will all have the same x coordinates as EM, and y extension is also the same (FIG. 3d). There will be no beam offsetting. To achieve beam offsetting, FAC can be placed in such a way that its cylinder axis forms a small angle with respect to EM (FIG. 3a and 3e). If we still let the axis of FAC lie in y-z plane, with such oblique geometry between FAC and EM, the points at EM that have different y coordinates will also have different x coordinates (FIG. 3a). With such arrangement, the images of the points of EM at the image plane A will thus have different but predetermined x" coordinate changes. The incident angle of the beams at A are different (as shown in FIG. 3b). The function of SAC is several folded. It collimates the beams coming from EM in slow axis (FIG. 3b), and focuses the beams in the fast axis at plane A (FIG. 3a).

Figure 4A:
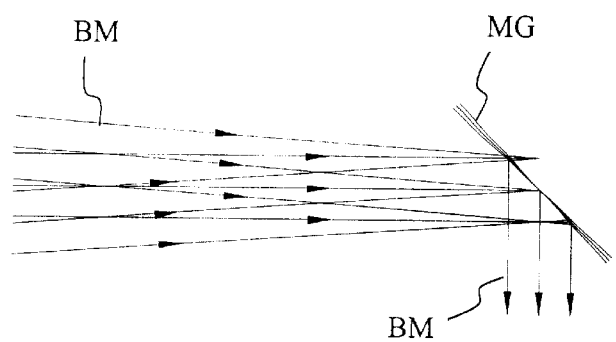
FIG. 4(a) and FIG. 4(b) show the principle of beam redirection by two embodiments, in which the beam redirection means in FIG. 4(a) is a mirror group, and in FIG. 4(b) the beam redirection means is an optical wedge group.
Figure 4B:
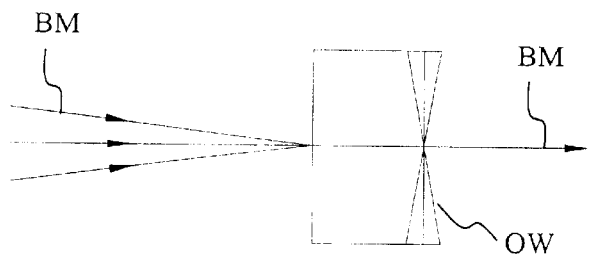

In this embodiment, the beam redirection (or rearranging) means comprises a group of small mirrors (or prisms, wedges) placed at the image plane A. FIG. 3(a) and FIG. 3(b) show the case of mirrors, where, for clarity, only three mirrors are shown and only the reflection surface of the mirrors are illustrated. The mirrors reflects (refracts) beams at different height so that the beams that have different incidence angles now travel to the same direction. This can be achieved by offsetting each of the mirrors (or prisms) in the group for a predetermined angle. FIG. 4(a) is the schematic view for using a mirror group MG for the beam redirection. FIG. 4(b) is the schematic illustration for the case of refraction using optical wedges OW (three wedges are shown). In general, if the number of emitters is not considered, such rearrangement thus results in the shape of the beam spots as P2. It is obvious that a group of prisms (such as 45°–90° prisms) can also be used as mirrors by taking advantages of the property of total internal reflection. Therefore, with this embodiment, Lagrange invariant of the resulting beam increased approximately by n-fold in fast axis and reduced approximately by n-fold in slow axis comparing with the Lagrange invariant of the beams directly emitted from EM, where n is the number of mirrors (or prisms). The collimated beams thus can have similar Lagrange invarinat in both x and y directions. It is obvious that other beam redirection means can be use as well as long as the components has the ability to make the beams with different incident angle travel to substantially the same direction.

If the number of mirrors in the mirror (or prism/wedge) group is made the same as the number of emitters of LDA, and the angle between EM and FAC is made such so that the image of each emitter falls on only one mirror, respectively, the shape of the resulting beam spot will has a shape as P1. The beam brightness will be increased by about m times, where m is the reciprocal of emitter filling factor of the LDA.

Therefore, with this embodiment, Lagrange invariant of the resulting beam increased approximately by n-fold in fast axis and reduced approximately by n-fold in slow axis comparing with the Lagrange invariant of the beams directly emitted from EM. The collimated beams thus can have similar Lagrange invariant in both x and y directions.

In FIG. 3a, it is preferred that the width of the mirrors d1 in x' direction substantially equals to the width of the LDA image. The magnification is the ratio of focal lengths of SAC and FAC. If d1 is too large, the filling factor of beam spot could not be minimized and give lower brightness. If d1 is too small, the image of a single emitter may across two or even more mirrors in the mirror group. Since the light from each mirror travels in different directions, the divergence angle will increase resulting lower brightness. The aberration of lenses FAC and SAC could also increase the divergence angle causing lower brightness. It is preferred that the aberration of SAC and FAC are minimized to achieve the best results.

In the above embodiment, the beam offsetting means FAC plays both roles of fast axis collimation and beam offsetting. Of course these two functions can be performed with different components. This is shown in the embodiment illustrated in FIG. 5(a), FIG. 5(b) and FIG. 5(c). In this embodiment, the beam offsetting means includes CL and PSM. CL is a collimation lens that collimates the beams from LDA emitters in the fast axis. PSM is a prism group comprising a plurality of prisms. The beam paths of a few prisms (PM1, PMm, PMn) in PSM are shown in FIG. 5(c). The relationship between LDA and the PSM are shown in FIG. 5(b). The prisms are made so that the beams are bent to different but predetermined directions, and thus the beam offsetting is achieved. Same as the above embodiment, and also refer to FIG. 2, beam spot like P can be obtained with the use of OS and the beam redirection means, with all the beams travel to substantially the same direction.

The embodiment in FIG. 5 used a refraction method to achieve the beam offsetting. The same results can be obtained with the use of reflection method. FIG. 6 shows beam offsetting means including CL and MX comprising a plurality of mirrors that are placed with a predetermined angle offset. Only three mirrors are shown for clarity. The mirror group MX thus reflects the beams after the collimation lens CL to different, but predetermined, directions. The same as the above embodiments, by using OS (or SAC) and the beam redirection means, beam spot like P can be obtained, with all the beams traveling to substantially the same direction. Collimated beams thus can be made to have similar Lagrange invariant in both x and y directions.

Figure 7A:
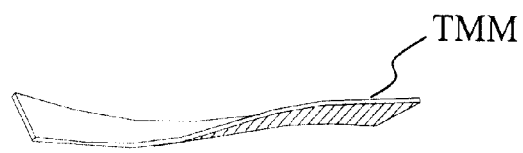
FIG. 7(a) is a schematic view of a twisted mirror that will give similar beam offsetting result as MX in FIG. 6.
Figure 7B:
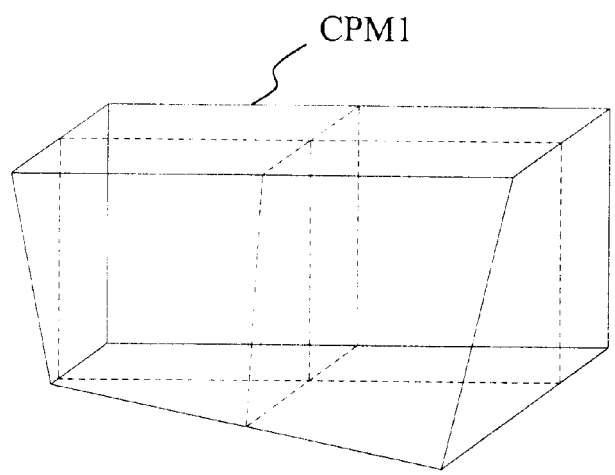
FIG. 7(b) and FIG. 7(c) shows two variations of PSM (FIG. 5) that have continuous surfaces.
Figure 7C:
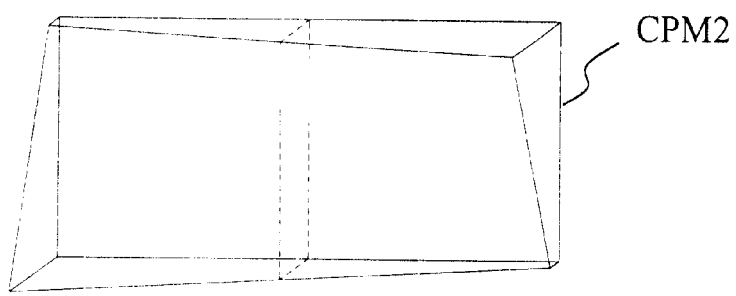

In the embodiments shown in FIG. 5 and FIG. 6, the component for beam offsetting is discrete. In FIG. 5 PSM comprises a group of individual prisms, and in FIG. 6 MX comprises a group of mirrors. Beam offsetting components with continuous surface can also be used. Two embodiments of such components are shown in FIG. 7. FIG. 7(a) illustrated a twisted mirror TMM. By replacing MX in FIG. 6 with TMM, beam offsetting can also be achieved. FIG. 7(b) and FIG. 7(c) are two different variations of PSM with continuous surfaces as shown by beam-bending blocks CPM1 and CPM2. Both can be used to replace PSM in FIG. 5 to give similar result. It should be noted that cross-sections similar to PM1, PMm, PMn can also be found in CPM1 and CPM2.

Figure 8A:
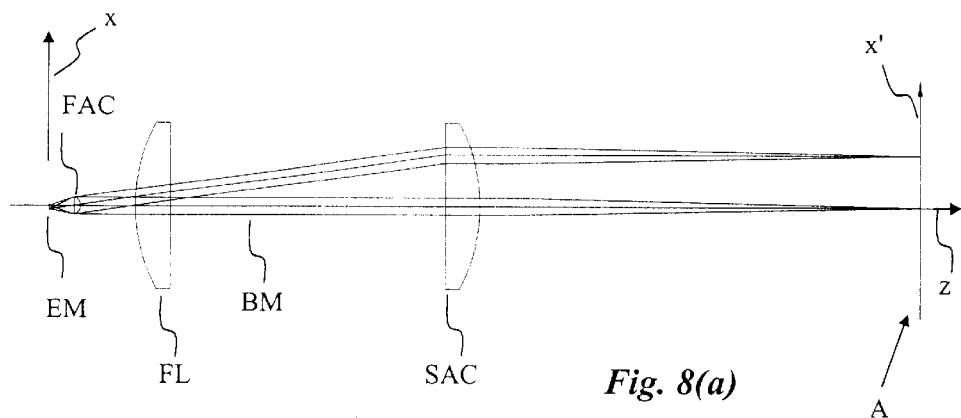
FIG. 8(a) and FIG. 8(b) show two views of another embodiment where a field lens is used.
Figure 8B:
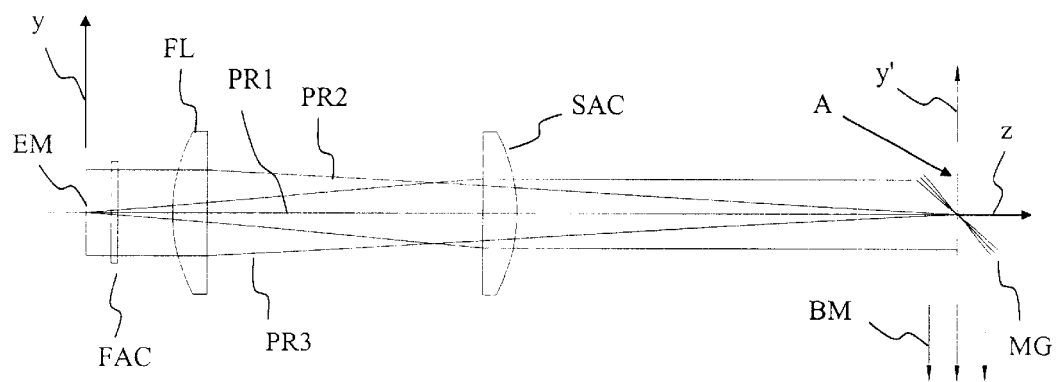

FIGS. 8(a) and 8(b) shows another embodiment in which EM is the LDA emitter, and A is the image plane. The beams are collimated by SAC in slow axis. FL is a field lens, which focuses the principal ray (PR1, PR2, PR3) from the LDA at A (FIG. 8(b)). The beams at fast axis after passing FL and SAC are imaged by FAC at A (FIG. (8a)). The same as the embodiment disclosed above, FAC is placed in such a way that its cylinder axis forms a small angle with respect to EM to achieve beam offsetting.

With the same principle as the embodiment disclosed above, a beam redirection means such as a mirror group is placed at A. The beams with the principal ray traveling in different directions are redirected by the beam redirection means so that the beams travel in substantially the same direction. FL can also be a cylindrical lens that may have no dioptric power at the x-z plane. SAC could be a toroidal lens with slight different focuses in y-z plane and x-z plane.

Figure 9A:
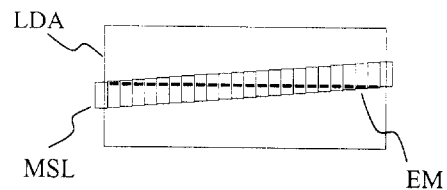
FIG. 9 shows another embodiment of the current invention, where a multi-section lens is used for beam offsetting, where FIG. 9(a) schematically shows the relationship between emitters and the lens.
FIG. 9(b) and FIG. 9(c) shows two views of the embodiment.
Figure 9B:
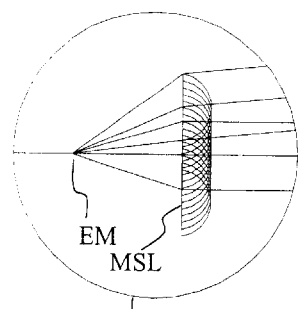
Figure 9B:
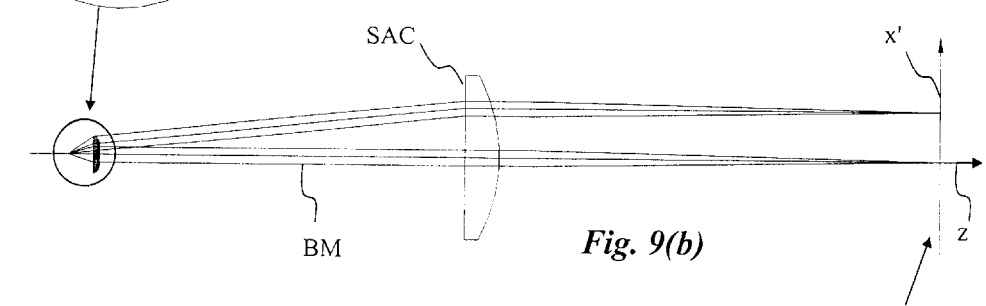
Figure 9C:
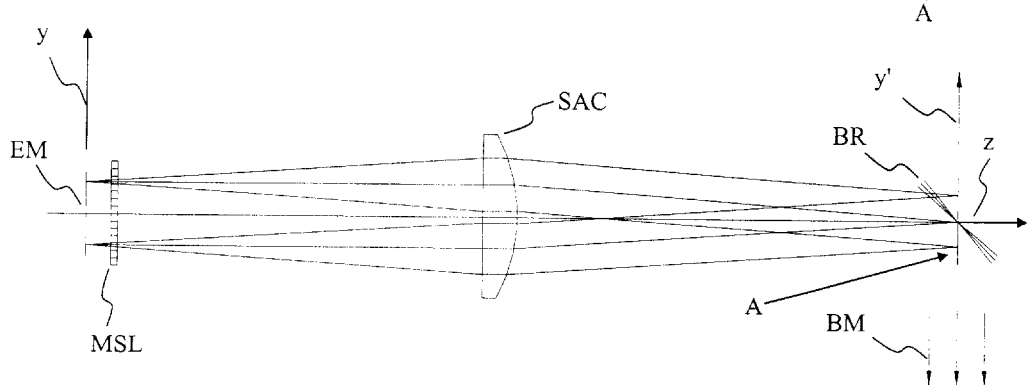

FIG. 9(b) and FIG. 9(c) shows two different schematic views of yet another embodiment achieving the object of beam shaping. The structure of this embodiment is similar to the one shown in FIG. 3, but, rather than using oblique arrangement, a multi-section lens MSL is used, where the cylinder axis of each section of the lens is parallel with the emitter line. FIG. 9(a) shows the schematic view of a multi-section lens in which each section of the lens has a predetermined offset from the section beside it. The beams from various sections of the LDA emitters are thus offset by the multi-section lens and the beams from each section of the lens form beam spots on the image plane A. In fact, any lens can be used as long as it sends the collimated beams from different section of emitter line to different, but predetermined, directions as shown in FIG. 10 (see below).

As in the earlier embodiments, the beam spots reach the image plane A with different incident angles. BR is a beam redirection means comprising a plurality of small mirrors placed at the image plane A. Each of the mirrors is placed with a predetermined angle to accommodate a beam spot having a particular incident angle so that all the reflected beams exit from the mirror group BR are steered to have substantially the same direction. Such rearrangement thus results in the shape of the beam spots as P1 or P2. It is obvious that a group of prisms (such as 45°–90° prisms) can also be used as mirrors by taking advantages of the property of total internal reflection. Or a group of optical wedges can be used instead of a mirror group so that the beams can be redirected by refraction within the optical wedges to achieve the same results. Therefore, with this embodiment, Lagrange invariant of the resulting beam increased approximately by n-fold in fast axis and reduced approximately by n-fold in slow axis comparing with the Lagrange invariant of the beams directly emitted from EM. And the collimated beams have similar Lagrange invariant in both x and y directions.

Figure 10A:
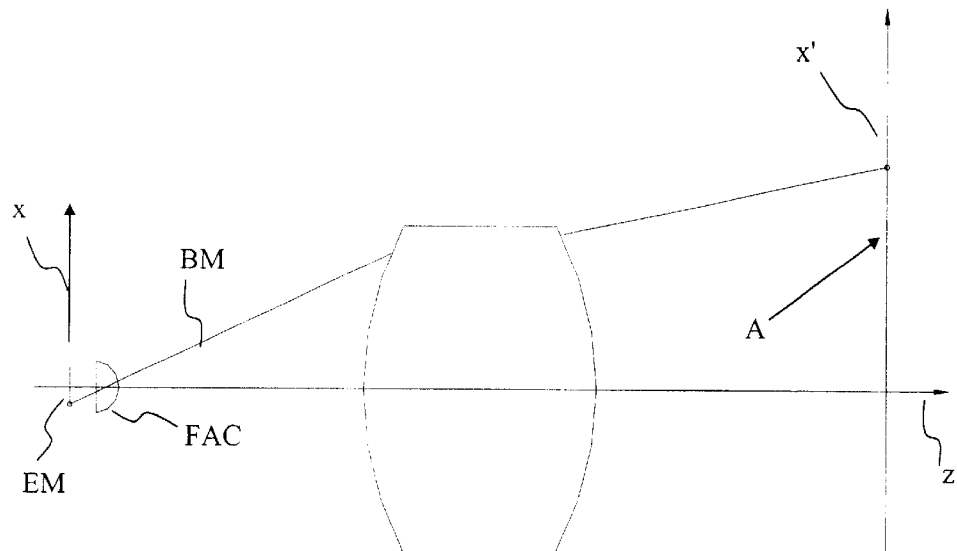
FIG. 10(a) and FIG. 10(b) schematically shows the method of beam shaping according to the current invention, in which an arbitrary optical system AOS forms offset images of the emitters onto the beam redirection means BR and allow each of the principal rays from LDA emitters to be focused on said beam redirection means so the rearranged beams travel in the same direction after the beam redirection means.
Figure 10B:
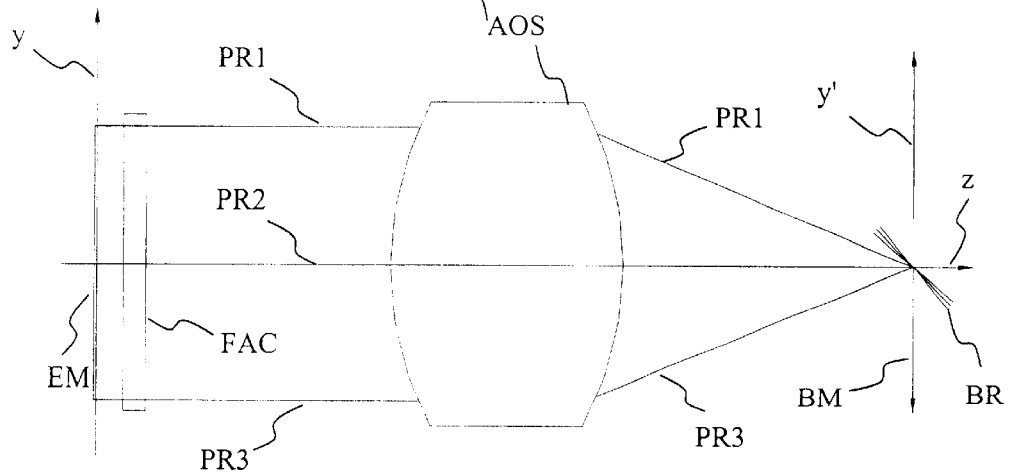

In general, with the current invention, the key step of beam shaping can be achieved by the oblique arrangement between LDA emitter and a cylindrical-like lens (FIG. 10). It can also be achieved by using specially designed lens such as the axial offset lens mentioned earlier without using the oblique arrangement, or achieved by using other beam offsetting means as shown above. An arbitrary optical system AOS can be placed to allow the offset images of the emitters to be formed on a beam redirection means BR (FIG. 10a) located at the image plane A, such as a mirror group, and to allow each of the principal rays from LDA emitters to be focused on said beam redirection means (FIG. 10b) so the rearranged beams travel in the same direction after the beam redirection means. To obtain the same results as mentioned in the embodiments above, or to obtain the beams with optimized Lagrange invariant, multi-plano-mirror can be used as the beam redirection means if the beams are substantially collimated in both fast and slow axes. Multi-spherical or toroidal mirrors can be used as the beam redirection means if the beams are not substantially collimated.

Based upon the requirement of redirecting beams to travel in substantially the same direction after the beam redirection means, it is obvious that if the beams are not substantially collimated in the x-z plane (ref. FIG. 10(a)), proper inclination and offset of the beam redirection means will be preferred to accommodate the incoming beam so that the exit beam from the beam redirection means to be optimized. For example, if a multi-mirror group is used as the beam redirection means, besides the offset in x-y plane, inclination and offset of the mirror group in x-z plane will be preferred so that the beams after the mirror group travel in substantially the same direction.

Figure 11:
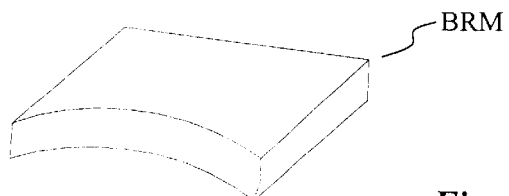
FIG. 11 schematically illustrate a single unit of a mirror to be used for the construction of a module that combines the function of OS and BR.

It was mentioned earlier in FIG. 2 that BDM and OS or BR and OS can be combined. As an embodiment, FIG. 11 shows a single small mirror that can be used for the construction of a combined module that has both the functions of OS and BR.

With the components described above, a high-efficiency diode pump solid state laser can be obtained, comprising a laser fiber with its core doped with active species (for cladding pumping fiber laser) or a laser rod (or disc) doped with active species, a focusing means, and a beam source comprising at least one laser diode array along with beam offsetting means, an image optics and beam redirection means, wherein said focusing means is disposed between said beam source and the aperture of said fiber or laser rod (or disc) and focuses the beam from said beam source onto the aperture of said laser fiber or laser rod (or disc), and wherein an optical relay system can be included for combination of beams from a plurality of laser diode arrays.

Figure 12:
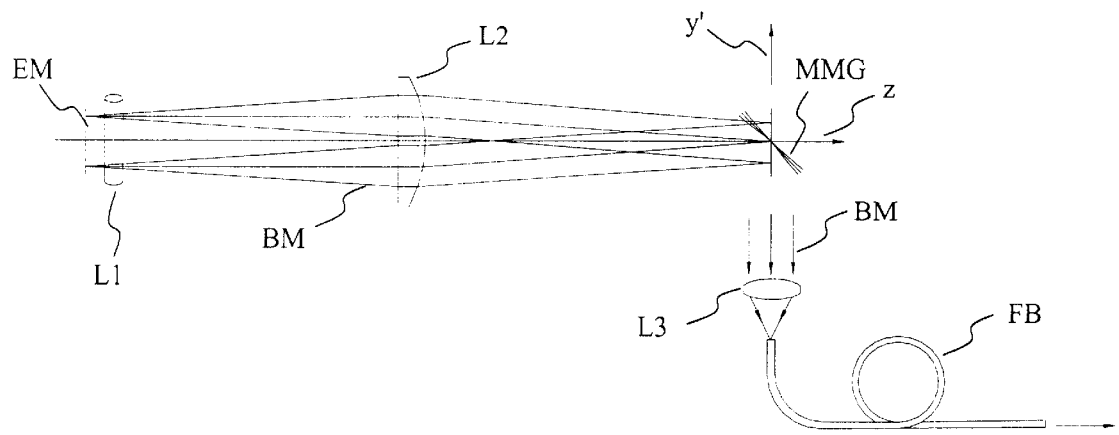
FIG. 12 is a schematic illustration of an embodiment of a fiber laser.

FIG. 12 shows an embodiment of a fiber laser, where EM is LDA emitter, and BM is the laser beam. L1 is a fast axis collimation lens that is tilted so that its cylindrical axis forms a small angle with the emitter line of LDA. The offset beams after L1 travel through L2 to reach a multi-mirror group MMG, where the offset beams having different incident angles are steered to travel in one direction. The beam spot after MMG is optimized and has similar Lagrange invariant in both fast and slow axis. L3 is a focal lens that focuses the collimated beam from MMG on the aperture of a laser fiber FB.

These methods and systems described above can also be used for transmission of power from laser diode arrays through an optical fiber. High power can be transmitted because the method disclosed above allowing high efficiency in coupling laser power from a plurality of laser diode arrays into an optical fiber. The high power transmitted in the optical fiber can then be used, for instance, for material processing and medical surgery directly. Therefore, an apparatus for laser beam transmission using an optical fiber can be made, comprising an optical fiber for beam transmission, a focusing means, and a beam source comprising at least one laser diode array along with a beam offsetting means, an image optics and a beam redirection means, wherein said focusing means is disposed between said beam source and the aperture of said optical fiber and focuses the beam from said beam source into the aperture of said optical fiber.

The foregoing descriptions of embodiments of the invention have been presented for the purpose of illustration and description. It is not intended to limit the invention to the precise form disclosed, and obviously many modification and variation are possible in light of above teaching.

Figure 13A:
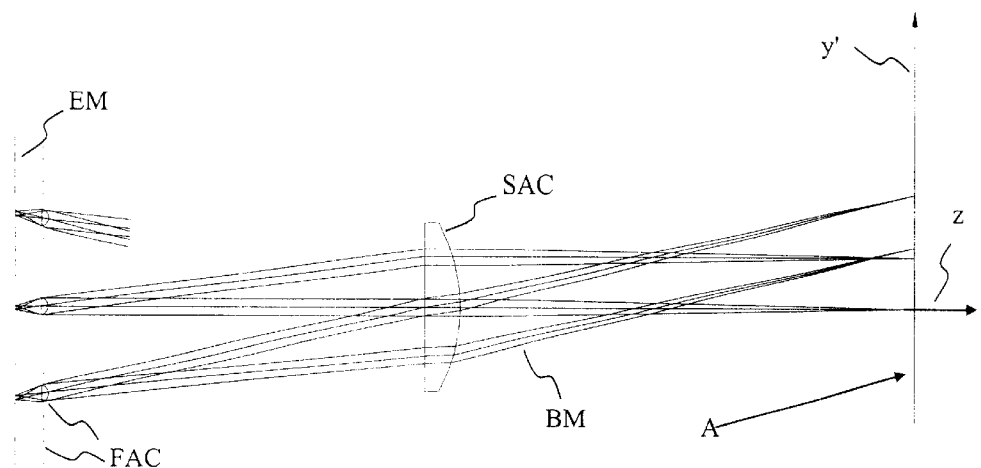
FIG. 13(a) and FIG. 13(b) show the two view of an embodiment of the current invention, in which a 2D-laser diode array is used with a series of FAC's.
Figure 13B:
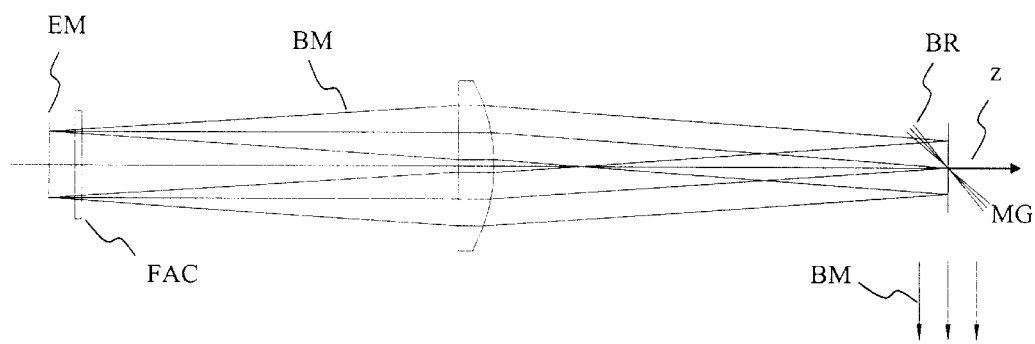

For example, optics can be used in certain cases to change the spacing of emitters of an LDA before the beam offsetting. Optical relays or polarizers can be used for combination of beams from several LDA's. Hybrid or plastic components can be used in some cases as well. The beam redirection means can be made into several groups with each group sending beams into a particular direction, respectively, functioning as a beam splitter. The beam after the redirection means can be used directly for material processing and medical therapeutics. The embodiments disclosed above for beam rearranging can also be used to optimize the focal spot of a 2-D array at the slow axis and fast axis. An embodiment is shown in FIG. 13, where a plurality of FAC's are used for beams from the 2-D array emitters, and each functions the same as in the embodiments mentioned earlier. Moreover, this beam shaping procedure is universal. Not only beams from laser diodes, but also other linear illumination sources can be reshaped and rearranged by the method disclosed in the present invention. The embodiments were chosen and described in order to best explain the principles of the invention and its practical applications to thereby enable others skilled in the art to best utilize the present invention. While specific values have been used and listed in the foregoing embodiments for the sake of easy to understand, they do not set limit on the invention teaching, which is properly described in the claims. The particular values and configurations discussed above can be varied and are cited merely to illustrate particular embodiments of the present invention and are not intended to limit the scope of the present invention.

What is claimed is:

1. An apparatus for beam shaping of laser diode array, comprising:

at least one laser diode array, a beam offsetting means, a beam redirection means, an optical system disposed between said beam offsetting means and said beam redirection means, wherein said beam offsetting means offsets the beams from the emitters of said laser diode array, and said optical system allows each of the offset beams to be focused on said beam redirection means so the beams travel in substantially the same direction after said beam redirection means.

2. An apparatus of claim 1, wherein said beam offsetting means comprises a cylindrical-like collimating means placed in front of said laser diode array wherein the cylinder axis of said collimating means forms a predetermined angle with the emitter line of said laser diode array.

3. An apparatus of claim 1, wherein said beam offsetting means comprises a collimation means and a beam offsetting prism group comprising a plurality of prisms, wherein said collimation means collimates the beams from the emitters of said laser diode array, and said prism group is made such that the collimated beam passing each prism is bent to a different but predetermined direction.

4. An apparatus of claim 1, wherein said beam offsetting means comprises a collimation means and a beam offsetting mirror group comprising a plurality of mirrors, wherein said collimation means collimates the beams from the emitters of said laser diode array, and said mirror group is made such that the collimated beam reaching each mirror is reflected to a different but predetermined direction.

5. An apparatus of claim 1, wherein said beam offsetting means comprises a collimation means and a twisted mirror for beam offsetting, wherein said collimation means collimates the beams from the emitters of said laser diode array, and said twisted mirror is made such that the collimated beam reaching different part of said twisted mirror is reflected to a different but predetermined direction.

6. An apparatus of claim 1, wherein said beam offsetting means comprises a collimation means and a beam-bending block for beam offsetting, wherein said collimation means collimates the beams from the emitters of said laser diode array, and said beam-bending block is made such that the collimated beam passing each part of said beam-bending block is refracted to a different but predetermined direction.

7. An apparatus of claim 1, wherein said beam offsetting means comprises a multi-section collimation lens placed in front of a laser diode array in which the cylinder axis of each section in the multi-section collimation lens is offset from the nearby section for a predetermined distance and is substantially parallel with the emitter line of said laser diode array.

8. An apparatus of claim 2, wherein the beam redirection means is a mirror group.

9. An apparatus of claim 2, wherein the beam redirection means is an optical wedge group.

10. A diode-pumped solid state laser apparatus comprising,

- a laser medium,
- a focusing means,
- a beam source comprising at least one laser diode array, a beam offsetting means, an image optics and a beam redirection means,
- wherein said beam offsetting means offsets the beams from the emitters of said laser diode array, and said imaging optics allows each of the offset beams to be focused on said beam redirection means so the beams travel in substantially the same direction after the beam redirection means, and wherein said focusing means is disposed between said beam source and the aperture of said laser medium and focuses the beam from said beam source onto the aperture of said laser medium.

11. An apparatus of claim 6, wherein said laser medium is a laser fiber with its core doped with active species.

12. An apparatus of claim 6, wherein said laser medium is a laser crystal doped with active species.

13. A fiber coupled laser diode array apparatus comprising,

- at least one optical fiber,
- a focusing means,
- a beam source comprising at least one laser diode array, a beam offsetting means, an image optics and a beam redirection means,
- wherein said beam offsetting means offsets the beams from the emitters of said laser diode array, and said imaging optics allows each of the offset beams to be focused on said beam redirection means so the beams travel in substantially the same direction after the beam redirection means, and wherein said focusing means is disposed between said beam source and the aperture of said optical fiber and focuses the beam from said beam source onto the aperture of said optical fiber.

* * * * *

(12) EX PARTE REEXAMINATION CERTIFICATE (5166th)
United States Patent
Wang et al.

(10) Number: US 6,462,883 C1
(45) Certificate Issued: Jul. 26, 2005

(54) OPTICAL COUPLING SYSTEM

(75) Inventors: Zhijiang Wang, Diamond Bar, CA (US); Qinyue Yu, Tustin, CA (US); Ying Wang, Diamond Bar, CA (US)

(73) Assignee: Apollo Instrutments, Inc., Irvine, CA (US)

Reexamination Request:
No. 90/006,646, May 22, 2003

Reexamination Certificate for:
Patent No.: 6,462,883
Issued: Oct. 8, 2002
Appl. No.: 09/644,804
Filed: Aug. 23, 2000

(51) Int. Cl.$^7$ .......... G02B 27/30; G02B 6/26; H01S 3/08
(52) U.S. Cl. .......... 359/641; 372/108; 385/31
(58) Field of Search .......... 359/618, 619, 359/624, 626, 625, 641, 640, 668; 362/259; 372/100, 6, 71, 108; 385/31, 33, 39

(56) References Cited

U.S. PATENT DOCUMENTS 5,500,764 A    3/1996  Armitage et al. ........... 359/341
5,657,153 A    8/1997  Endriz et al. ............... 359/341
6,421,178 B1   7/2002  Lissotschenko et al. .... 359/559

*Primary Examiner*—David N. Spector

(57) ABSTRACT

In the present invention, the methods and apparatus for making efficient laser beam coupling are disclosed. In particular, new structures for shaping and rearranging laser beams from diode laser array are disclosed. Along with the use of unique methods for coupling pumping laser beam into optical fiber or other media, high efficiency can be achieved. These aspects of the present invention will facilitate the realization of high-efficiency and high-power fiber lasers or other solid state lasers. The beam shaping structures can significantly improve the quality of the beams from diode laser array, and is easy to realize and less demanding in system alignment. Thus, a diode-pumped solid state laser of this invention may comprise a laser medium, a focusing means, a beam source comprising at least one laser diode array, a beam offsetting means, an image optics and a beam redirection means.

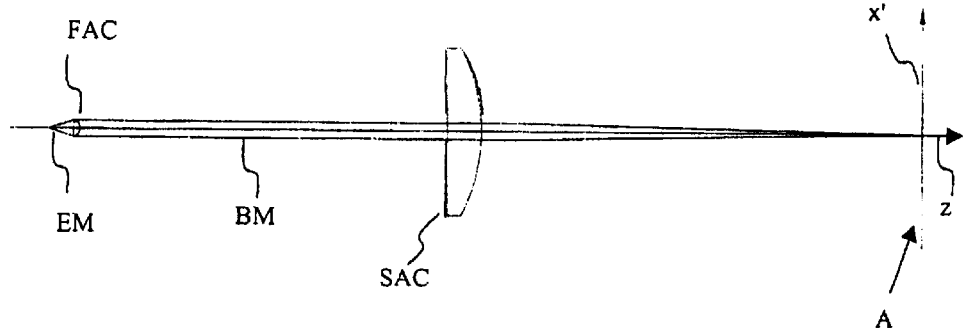

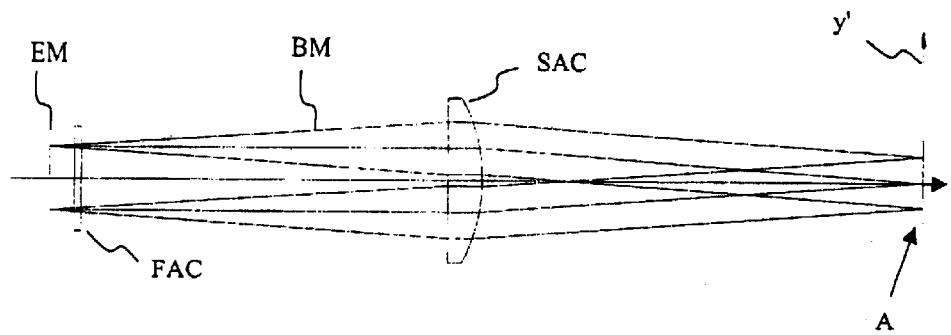

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 10 and 13 are determined to be patentable as amended.

Claims 2–9, 11 and 12, dependent on an amended claim, are determined to be patentable.

New claims 14–20 are added and determined to be patentable.

1. An apparatus for beam shaping of laser diode array, comprising:
    at least one laser diode array[,] *having a slow axis parallel to the length direction thereof, and a fast axis perpendicular to said slow axis;*
    a beam offsetting means[,] *having only fast axis collimation power;*
    a beam redirection means[,]*;*
    an optical system disposed between said beam offsetting means and said beam redirection means,
    wherein said beam offsetting means offsets the beams from the emitters of said laser diode array, and said optical system allows each of the offset beams to be focused on said beam redirection means so the beams travel in substantially the same direction after said beam redirection means.

10. A diode-pumped solid state laser apparatus comprising,
    a laser medium,
    a focusing means,
    a beam source comprising at least one laser diode array, *each laser of the laser diode array having a slow axis paralled to the length direction thereof, and a fast axis perpendicular to said slow axis;*
    a beam offsetting means[,] *having only fast axis collimation power;*
    [an image] *imaging* optics; and
    a beam redirection means,
    wherein said beam offsetting means offsets the beams from the emitters of said laser diode array, and said imaging optics allows each of the offset beams to be focused on said beam redirection means so the beams travel in substantially the same direction after the beam redirection means, and wherein said focusing means is disposed between said beam source and the aperture of said laser medium and focuses the beam from said beam source onto the aperture of said laser medium.

13. A fiber coupled laser diode array apparatus comprising,
    at least one optical fiber,
    a focusing means,
    a beam source comprising at least one laser diode array[,] *having slow axis parallel to the length direction thereof, and a fast axis perpendicular to said slow axis;*
    a beam offsetting means[,] *having only fast axis collimation power;*
    [an image] *imaging* optics; and
    a beam redirection means,
    wherein said beam offsetting means offsets the beams from the emitters of said laser diode array, and said imaging optics allows each of the offset beams to be focused on said beam redirection means so the beams travel in substantially the same direction after the beam redirection means, and wherein said focusing means is disposed between said beam source and the aperture of said optical fiber and focuses the beam from said beam source onto the aperture of said optical fiber.

14. *An apparatus for beam shaping of laser diode array comprising,*
    *at least one laser diode array,*
    *a beam offsetting means,*
    *a beam redirection means,*
    *an optical system disposed between said beam offsetting means and said beam redirection means,*
    *wherein said beam offsetting means offsets the beams from the emitters of said laser diode array, and said optical system allows each of the offset beams to be focused on said beam redirection means so the beams travel in substantially the same direction after said beam redirection means; and*
    *wherein said beam offsetting means comprises a cylindrical-like collimating means placed in front of said laser diode array wherein the cylinder axis of said collimating means forms a predetermined angle with the emitter line of said laser diode array.*

15. *An apparatus for beam shaping of laser diode array comprising,*
    *at least one laser diode array,*
    *a beam offsetting means,*
    *a beam redirection means,*
    *an optical system disposed between said beam offsetting means and said beam redirection means,*
    *wherein said beam offsetting means offsets the beams from the emitters of said laser diode array, and said optical system allows each of the offset beams to be focused on said beam redirection means so the beams travel in substantially the same direction after said beam redirection means; and*
    *wherein said beam offsetting means comprises a collimation means and a beam offsetting prism group comprising a plurality of prisms, wherein said collimation means collimates the beams from the emitters of said laser diode array, and said prism group is made such that the collimated beam passing each prism is bent to a different but predetermined direction.*

16. *An apparatus for beam shaping of laser diode array comprising,*
    *at least one laser diode array,*
    *a beam offsetting means,*
    *a beam redirection means,*
    *an optical system disposed between said beam offsetting means and said beam redirection means,*
    *wherein said beam offsetting means offsets the beams from the emitters of said laser diode array, and said optical* system allows each of the offset beams to be focused on said beam redirection means so the beams travel in substantially the same direction after said beam redirection means; and wherein said beam offsetting means comprises a collimation means and a beam offsetting mirror group comprising a plurality of mirrors, wherein said collimation means collimates the beams from the emitters of said laser diode array, and said mirror group is made such that the collimated beam reaching each mirror is reflected to a different but predetermined direction.

17. An apparatus for beam shaping of laser diode array comprising, at least one laser diode array, a beam offsetting means, a beam redirection means, an optical system disposed between said beam offsetting means and said beam redirection means, wherein said beam offsetting means offsets the beams from the emitters of said laser diode array, and said optical sytem allows each of the offset beams to be focused on said beam redirection means so the beams travel in substantially the same direction after said beam redirection means; and wherein said beam offsetting means comprises a multi-section collimation lens placed in front of a laser diode array in which the cylinder axis of each section in the multi-section collimation lens is offset from the nearby section for a predetermined distance and is substantially parallel with the emitter line of said laser diode array.

18. An apparatus of claim 17, wherein the beam redirection means is a mirror group.

19. An apparatus of claim 17, wherein the beam redirection means is an optical wedge group.

20. An apparatus for beam shaping of laser diode array comprising, at least one laser diode array, a beam offsetting means, a beam redirection means, an optical system disposed between said beam offsetting means and said beam redirection means, wherein said beam offsetting means offsets the beams from the emitters of said laser diode array, and said optical system allows each of the offset beams to be focused on said beam redirection means so the beams travel in substantially the same direction after said beam redirection means;

wherein said beam offsetting means comprises a collimation means and a beam-bending block for beam offsetting, wherein said collimation means collimates the beams from the emitters of said laser diode array, and said beam-bending block is made such that the collimated beam passing each part of said beam-bending block is refracted to a different but predetermined direction; and wherein said laser medium is a laser crystal doped with active species.

* * * * *